US008092230B2

(12) United States Patent
Swanger et al.

(10) Patent No.: US 8,092,230 B2
(45) Date of Patent: Jan. 10, 2012

(54) ALIGNMENT FRAME FOR RETAINING A MODULE ON A CIRCUIT BOARD

(75) Inventors: Nathan W. Swanger, Mechanicsburg, PA (US); Justin S. McClellan, Camp Hill, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 40 days.

(21) Appl. No.: 12/814,239

(22) Filed: Jun. 11, 2010

(65) Prior Publication Data

US 2011/0306219 A1    Dec. 15, 2011

(51) Int. Cl.
*H01R 12/00* (2006.01)
(52) U.S. Cl. ......................................... 439/65; 439/903
(58) Field of Classification Search .............. 439/65–73, 439/903
See application file for complete search history.

(56) References Cited

U.S. PATENT DOCUMENTS

| 6,898,083 | B1 | 5/2005 | Hornung |
| 7,090,507 | B2 | 8/2006 | Wertz et al. |
| 7,957,149 | B2 * | 6/2011 | Barina et al. ................. 361/720 |

* cited by examiner

*Primary Examiner* — Khiem Nguyen (57) ABSTRACT

An alignment frame is provided. The frame includes a plurality of frame members coupled together to form a base. The base is configured to surround an electronic module to provide a protective cover for the electronic module. The base includes corners formed at intersections of the frame members. An alignment member is positioned on at least one corner of the base. The alignment member is configured to align an electronic module with respect to an electrical connector on a circuit board. A coupling member extends from at least one corner of the base. The coupling member is configured to be through-hole mounted to an aperture in the circuit board. The coupling member includes a retention feature configured to create a press-fit with an inner surface of the aperture.

20 Claims, 5 Drawing Sheets

ALIGNMENT FRAME FOR RETAINING A MODULE ON A CIRCUIT BOARD

BACKGROUND OF THE INVENTION

The subject matter herein relates generally to printed circuit boards and, more particularly, to an alignment frame for retaining an electronic module on a printed circuit board.

Circuit boards include electrical connectors that engage electronic modules positioned on the circuit board. The electrical connectors electrically join the electronic module and the circuit board. The electrical connectors may also form a mechanical connection between the electronic module and the circuit board. Additionally, alignment pins may be used to align an electronic module with respect to an electrical connector on the circuit board. An end of the alignment pin is through-hole mounted into an aperture formed in the circuit board. Another end of the alignment pin engages the electronic module to align an electrical connector of the electronic module with an electrical connector of the circuit board.

However, alignment pins typically require additional manufacturing. Specifically, the apertures in the circuit board are generally formed with varying diameters due to inconsistencies in manufacturing. Accordingly, the alignment pins may not fit properly within the apertures. Typically, alignment pins are tailor fit to a specific aperture into which the alignment pin is to be inserted. Tailor fitting the alignment pins requires additional manufacturing time and costs. An alignment pin is also restricted to use within the aperture for which the alignment pin was tailor fit. Replacing the alignment pin requires further manufacturing and costs to tailor fit a new alignment pin.

Additionally, the electrical connectors may be exposed to dust and debris that comes in contact with the circuit board and electronic module. Circuit boards typically do not provide covers and or other suitable protection from the dust and debris. The dust and debris may damage the circuit board and/or electronic module.

Accordingly, there is a need for an alignment frame that retains an electronic module on a circuit board without the need to tailor fit the frame for apertures formed in the circuit board. Another need exists for an alignment frame that protects the circuit board and electronic module from dust and debris.

SUMMARY OF THE INVENTION

In one embodiment, an alignment frame is provided. The frame includes a plurality of frame members coupled together to form a base. The base is configured to surround an electronic module to provide a protective cover for the electronic module. The base includes corners formed at intersections of the frame members. An alignment member is positioned on at least one corner of the base. The alignment member is configured to align an electronic module with respect to an electrical connector on a circuit board. A coupling member extends from at least one corner of the base. The coupling member is configured to be through-hole mounted to an aperture in the circuit board. The coupling member includes a retention feature configured to create a press-fit with an inner surface of the aperture.

In another embodiment, an electronic assembly is provided. The electronic assembly includes a circuit board having an electrical connector positioned thereon. The circuit board has an aperture extending therethrough. An electronic module is electrically coupled to the electrical connector. An alignment frame aligns the electronic module with respect to the electrical connector. The alignment frame includes a plurality of frame members coupled together to form a base. The base surrounds the electronic module to provide a protective cover around the electronic module. The base includes corners formed at intersections of the frame members. An alignment member is positioned on at least one corner of the base. The alignment member aligns the electronic module with respect to the electrical connector. A coupling member extends from at least one corner of the base. The coupling member is through-hole mounted to the aperture in the circuit board. The coupling member includes a retention feature that creates a press-fit with an inner surface of the aperture.

DETAILED DESCRIPTION OF THE DRAWINGS

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
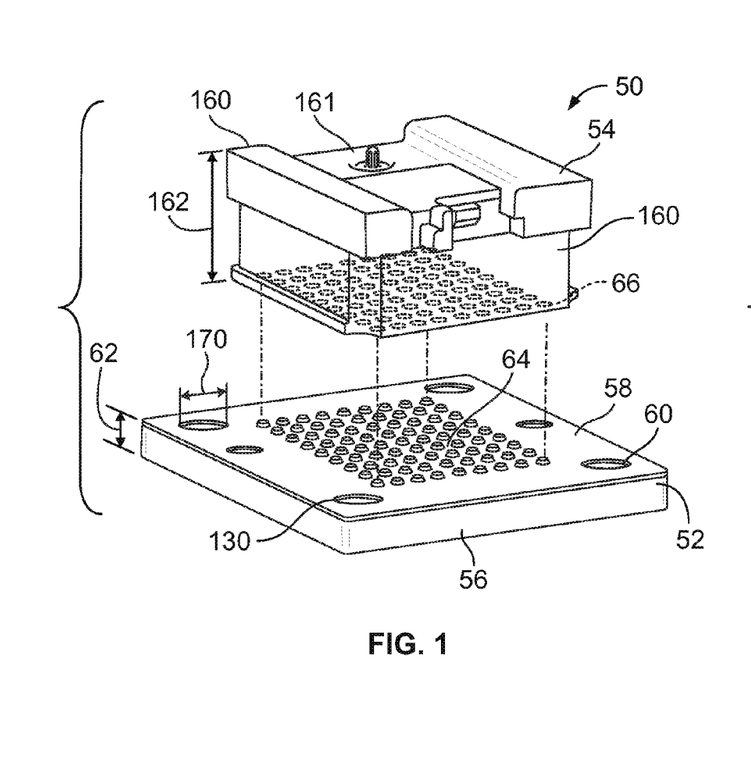
FIG. 1 is an exploded view of an electronic assembly.

FIG. 1 illustrates an electronic assembly 50 having a circuit board 52 and an electronic module 54. The module 54 is configured to electrically and mechanically couple to the circuit board 52. The circuit board 52 includes a base 56 and a circuitry layer 58 positioned on the base 56. In an exemplary embodiment, the base 56 is a reinforced epoxy laminate, for example a woven fiberglass cloth with an epoxy resin. The base 56 may be FR-4 graded by the National Electrical Manufactures Association and may be flame resistant. The base 56 includes apertures 60 extending therethrough. The apertures 60 extend an entire depth 62 of the base 56 and have an inner surface 130. The apertures 60 have a diameter 170. The apertures 60 may be configured to receive pins and/or posts that align the module 54 with respect to the circuit board 52. The apertures 60 may have varying diameters 170 due to manufacturing inconsistencies. In an example embodiment, the apertures 60 also extend through the circuitry layer 58.

The circuitry layer 58 may be formed from a layer of insulative material, such as a polyimide material having a high heat and chemical resistance. For example, the insulative material may be any one of Apical, Kapton, UPILEX, VTEC PI, Norton TH, Kaptrex, or a combination thereof. Conductive pathways, for example, signal traces and/or power traces, may extend through the insulative material. The insulative material reduces an amount of heat conducted by the conductive pathways. An electrical connector 64 is positioned on the circuitry layer 58. The electrical connector 64 may be electrically coupled to the conductive pathways extending through the circuitry layer 58. In the exemplary embodiment, the electrical connector 64 is a 9×9 pin assembly. Alternatively, the electrical connector 64 may include any number of pins. In another embodiment, the electrical connector 64 may be any suitable connector for coupling to the module 54.

The module 54 may be any suitable module for coupling to a circuit board, for example, a voltage regulator module, a power module, a network module, an input/output module, a storage module, a connector module, a processing module, or the like. The module 54 includes sides 160 and a top 161. The module 54 has a bottom flange 163. The module has a height 162. The module 54 includes an electrical connector 66. The electrical connector 66 is configured to engage the electrical connector 64. In the exemplary embodiment, the electrical connector 66 is a 9×9 pin assembly. Alternatively, the electrical connector 66 may include any number of pins. In another embodiment, the electrical connector 66 may be any suitable connector for coupling to the electrical connector 64. The electrical connectors 64 and 66 provide electrical coupling between the circuit board 52 and the module 54. In an exemplary embodiment, the electrical connectors 64 and 66 also provide mechanical coupling between the circuit board 52 and the module 54. The electrical connectors 64 and 66 retain the module 54 on the circuit board 52.

Figure 2:
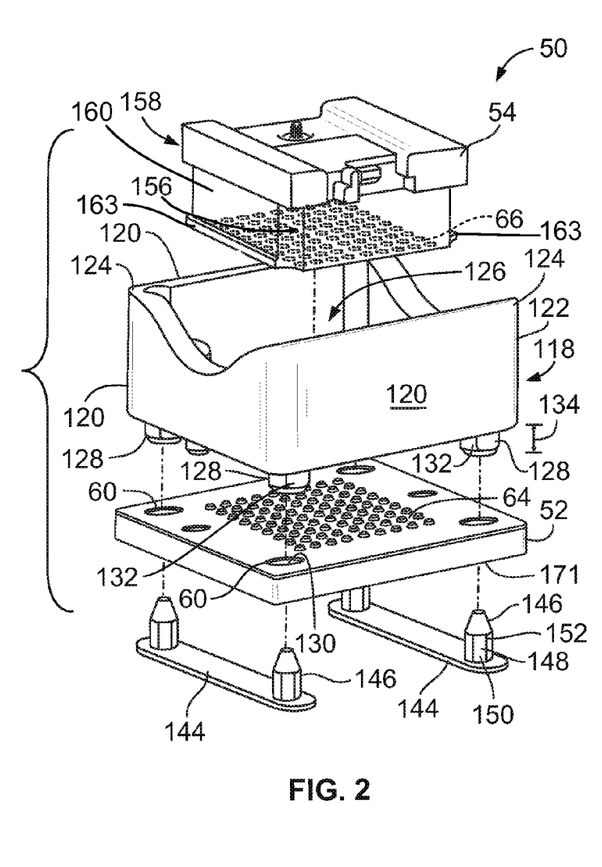
FIG. 2 is an exploded view of the electronic assembly, shown in FIG. 1, coupled with an alignment frame formed in accordance with an embodiment.

FIG. 2 is an exploded view of the electronic assembly 50 joined with an alignment frame 118 formed in accordance with an embodiment. The frame 118 is provided to retain the module 54 on the circuit board 52. The frame 118 includes a plurality of frame members 120. The frame members 120 are coupled together to form a base 122 of the frame 118. The base 122 includes corners 124 that are formed at each intersection of a pair of frame members 120. The base 122 is sized to be positioned on the circuit board 52. The base 122 has an opening 126 extending therethrough. The electrical connector 64 of the circuit board 52 is configured to be accessible through the opening 126 when the base 122 is positioned on the circuit board 52.

A coupling member 128 extends from each corner 124 of the base 122. The coupling member 128 is configured to be mounted to the circuit board 52. In the illustrated embodiment, each coupling member 128 is through-hole mounted to one of the apertures 60 so that the base 122 surrounds the electrical connector 64. The coupling member 128 may include a retention feature 132 that creates a press-fit with the inner surface 130 of the aperture 60. The retention feature 132 is illustrated as a rib that extends a portion of the length 134 of the coupling member 128. The retention feature 132 may extend any portion of the length 134 of the coupling member 128 or may extend the entire length 134 of the coupling member 128. Optionally, the retention feature 132 may extend along a perimeter of the coupling member 128. The coupling member 128 may include multiple flat sides that intersect to form corners. The retention feature 132 may be formed at the corners of the coupling member 128. The coupling member 128 may also have varying diameters along the length 134 of the coupling member 128. The retention features 132 may be formed at the greatest diameter of the coupling member 128. In another embodiment, the retention feature 132 may include a flexible flange. Alternatively, the retention feature 132 may be tapered.

Figure 3:
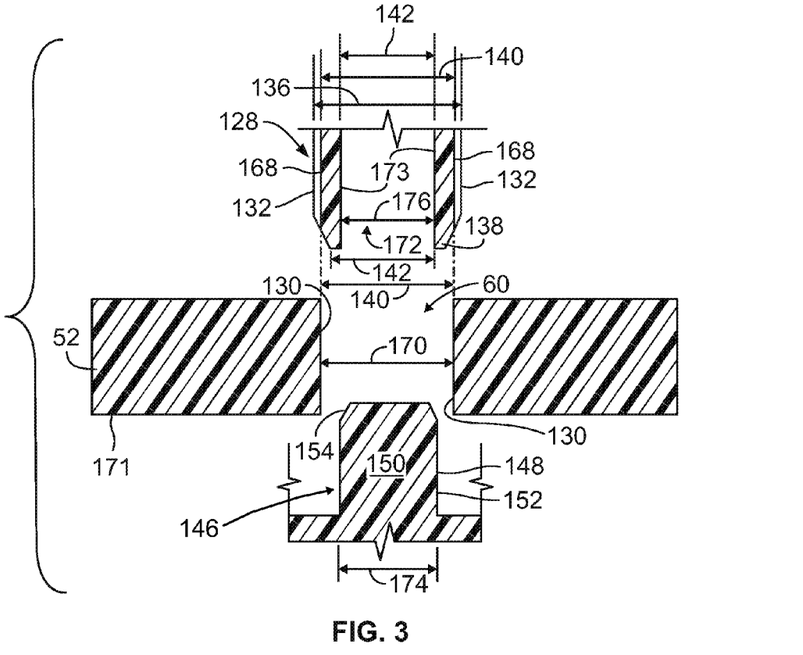
FIG. 3 is a cross-sectional view of a coupling member, shown in FIG. 2, being inserted into the circuit board, shown in FIG. 2.

FIG. 3 illustrates a cross-sectional view of the coupling member 128 being inserted into the circuit board 52. The cross-sectional view is taken along a portion of the coupling member 128 at the retention feature 132. FIG. 3 illustrates a pair of retention features 132 on opposite sides of the recess 168 of the coupling member 128. The coupling member 128 may include any number of retention features 132 along the perimeter thereof. The coupling member 128 has a width 136 at the retention features 132. The width 136 is greater than a diameter 170 of the aperture 60. When the coupling member 128 is inserted into the aperture 60, the retention features 132 deform to create a press-fit between the coupling member 128 and the inner surface 130 of the aperture 60. Alternatively, the inner surface 130 of the aperture 60 may deform. The retention feature 132 accommodates a press-fit coupling between the coupling member 128 and apertures 60 having varying diameters 170.

In the illustrated embodiment, the coupling member 128 also includes a tapered end 138. The tapered end 138 narrows from a width 140 to a width 142 at an end of the coupling member 128. In one embodiment, the coupling member 128 may not include the retention features 132. In such an embodiment, the tapered end 138 may function as a retention feature, wherein the width 140 is greater than the diameter 170 of the aperture 60. The tapered end 138 deforms to create a press-fit between the coupling member 128 and the inner surface 130 of the aperture 60. Alternatively, the inner surface 130 of the aperture 60 deforms.

Referring back to FIG. 2, the electronic assembly 50 also includes a pair of coupling plates 144. Each coupling plate 144 includes a pair of stuffer pins 146. Alternatively, the stuffer pins 146 may not be coupled to a coupling plate, but rather are independent of one another. The stuffer pins 146 are configured to be received in an opening 172 (shown in FIG. 3) formed in the coupling member 128. The stuffer pins 146 lock the coupling members 128 to the circuit board 52. The coupling plates 144 are configured to position flush against a bottom surface 171 of the circuit board 52 when the stuffer pins 146 are inserted into the coupling members 128.

The stuffer pins 146 include a retention feature 148. The retention feature 148 creates a press-fit between the stuffer pin 146 and the coupling member 128. In the illustrated embodiment, the stuffer pins 146 include flat sides 150 that intersect at corners 152. A retention feature 148 is formed at each corner 152. FIG. 3 illustrates a cross-sectional view of the stuffer pin 146. At the retention features 148, the stuffer pin 146 has a cross-sectional width 174 that is greater than a diameter 176 of the opening 172 formed in the coupling member 128. The corners 152 deform and contact an inner surface 173 of the opening 172 to create the press-fit between the stuffer pin 146 and the coupling member 128. Alternatively, the inner surface 173 of the opening 172 may deform to receive the stuffer pin 146. The stuffer pins 146 also include a tapered end 154. The tapered end 154 may also operate as a retention feature to create a press-fit with the coupling member 128.

Referring back to FIG. 2, the electronic assembly 50 may also include an alignment member (not shown) positioned at the corners 124 of the base 122. Alternatively, the alignment member may be formed at any location of the frame 118. The alignment member is configured to engage the module 54. The module 54 includes a recess 156 formed at a corner 158 of the module 54. The alignment member is configured to engage a wall of the recess 156 to align and retain the electronic module 54 on the circuit board 52. The alignment member may generate a force on the module 54 to secure the module 54 to the circuit board 52.

Figure 4:
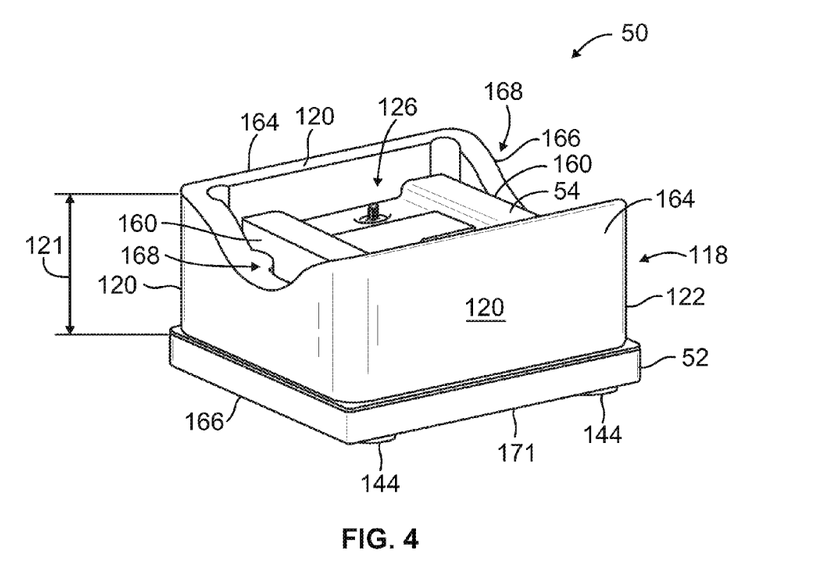
FIG. 4 is a perspective view of the electronic assembly shown in FIG. 2.

FIG. 4 illustrates the electronic assembly 50 in an assembled configuration. The frame 118 is positioned flush on the circuit board 52. The coupling members 128 (shown in FIG. 2) are press-fit coupled into the apertures 60 to retain the frame 118 on the circuit board 52. The coupling plates 144 are coupled to the frame 118 so that the stuffer pins 146 (shown in FIG. 2) are press-fit into the coupling members 128 and the coupling plates 144 are positioned flush with the bottom surface 171 of the circuit board 52. The base 122 surrounds the electrical connector 64 (shown in FIG. 2) of the circuit board 52. The opening 126 in the base 122 provides access to the electrical connector 64. The module 54 is inserted into the opening 126 in the base 122. The electrical connector 66 of the module 54 engages the electrical connector 64 of the circuit board. The frame members 120 engage the bottom flange 163 of the module to retain the module 54 on the circuit board 52.

Each frame member 120 extends along a side 160 of the module 54. In the illustrated embodiment, the frame members 120 function as a protective cover for the module 54 to limit an amount of dust and debris that may come in contact with the module 54. The frame members 120 have a height 121 that corresponds to at least a portion of the height 162 of the module 54. The height 121 of the frame members 120 may also extend an entire height 162 of the module 54. In the illustrated embodiment, a pair of frame members 164 extends greater than a height of the module 54. The frame members 164 are illustrated as extending along opposite sides 160 of the module 54. Optionally, the frame members 164 may be adjacent. The frame 118 may include any number of frame members 164. FIG. 4 also illustrates frame members 166 having a recess 168. The recess 168 provides access to the module 54 so that the module 54 may be coupled to and/or removed from the circuit board 52. The frame members 166 are illustrated as extending along opposite sides 160 of the module 54. Optionally, the frame members 166 may be adjacent. The frame 118 may include any number of frame members 166.

Figure 5:
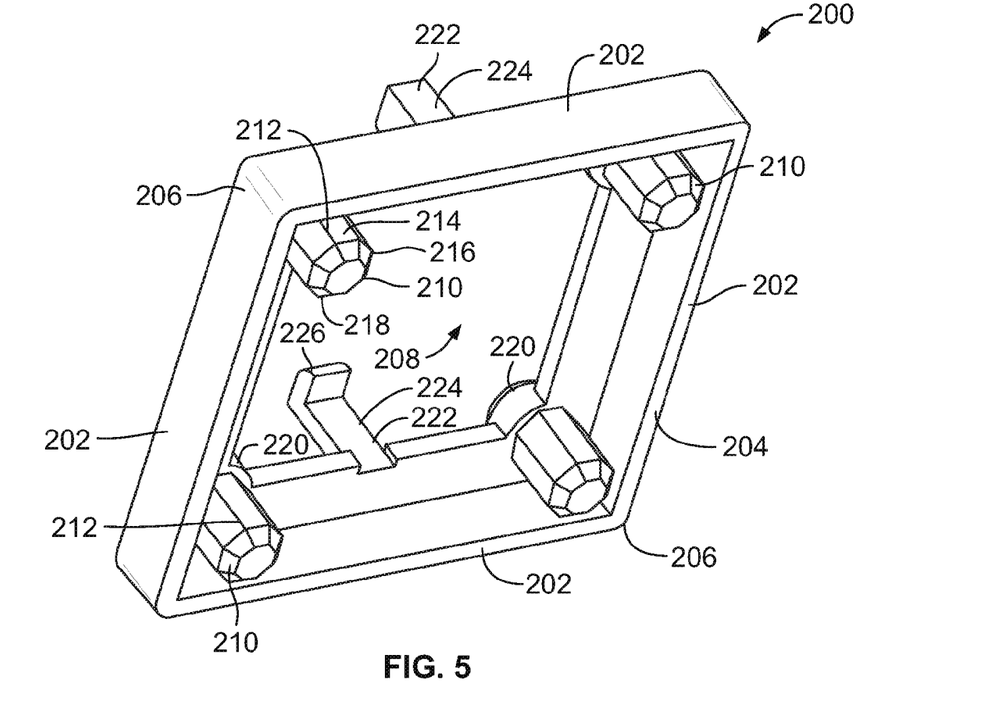
FIG. 5 is a bottom perspective view of an electronic assembly frame formed in accordance with an embodiment.

FIG. 5 illustrates a frame 200 formed in accordance with an embodiment and that may be used with the electronic assembly 50. The frame 200 includes frame members 202. The frame members 202 are coupled to form a base 204. The base 204 includes corners 206 formed at intersections of the frame members 202. The base 204 also includes an opening 208 extending therethrough. The frame 200 is configured to couple to the circuit board 52 so that the frame members 202 surround the electrical connector 64. The opening 208 provides access to the electrical connector 64 when the frame 200 is coupled to the circuit board 52. The module 54 is configured to be received through the opening 208 so that the electrical connector 66 of the module 54 engages the electrical connector 64 of the circuit board 52.

The frame 200 provides a protective cover for the electronic module 54. The frame 200 protects the electronic module 54 and the circuit board 52 from dust and debris. The frame members 202 may extend at least a portion of the height 162 of the module 54 to limit an amount of dust and debris that may come in contact with the module 54. The frame members 202 may also extend an entire height 162 of the module 54.

The frame 200 includes a coupling member 210 extending from each corner 206 of the base 204. The coupling members 210 are configured to be press-fit into the apertures 60 of the circuit board 52. The coupling members 210 include retention features 212 that engage the inner surface 130 of the aperture 60. In the illustrated embodiment, the coupling members 210 include flat sides 214 that intersect at corners 216. A retention feature 212 is formed at each corner 216. The corners 216 deform and contact the inner surface 130 of the aperture 60 to create the press-fit between the coupling member 210 and the circuit board 52. Alternatively, the inner surface 130 of the aperture 60 deforms to receive the coupling member 210. The coupling members 210 also include a tapered end 218. The tapered end 218 may also function as a retention feature 212 to create a press-fit with the circuit board 52.

An alignment member 220 is positioned at each corner 206 of the base 204. Alternatively, the alignment member 220 may be formed at any intermediate position of the frame members 202 between a pair of corners 206. The alignment member 220 is configured to engage a wall of the recess 156 of the module. Optionally, the alignment member 220 may engage any portion of the module 54. The alignment member 220 is configured to align and retain the module 54 on the circuit board 52. In the illustrated embodiment, the alignment member 220 is rounded to engage the rounded wall of the recess 156 of the module 54. Optionally, the alignment member 220 may have any shape that corresponds to a shape of the recess 156 formed on the module 54. Alternatively, the alignment member 220 may be a tab, a notch, a rail, or the like. The alignment member 220 aligns the module 54 with respect to the circuit board 52 so that the electrical connector 66 of the module 54 aligns properly with the electrical connector 64 of the circuit board 52.

The frame 200 also includes latches 222 extending from the frame members 202. FIG. 5 illustrates two latches 222 extending from opposite frame members 202. Alternatively, the latches 222 may extend from adjacent frame members 202. The frame 200 may also include any number of latches 222. The latches 222 include an arm 224 that is configured to extend along a side 160 of the module 54. A hook 226 is positioned at the end of each arm 224. The hook 226 is configured to engage the top 161 of the module 54 to retain the module 54 on the circuit board 52.

Figure 6:
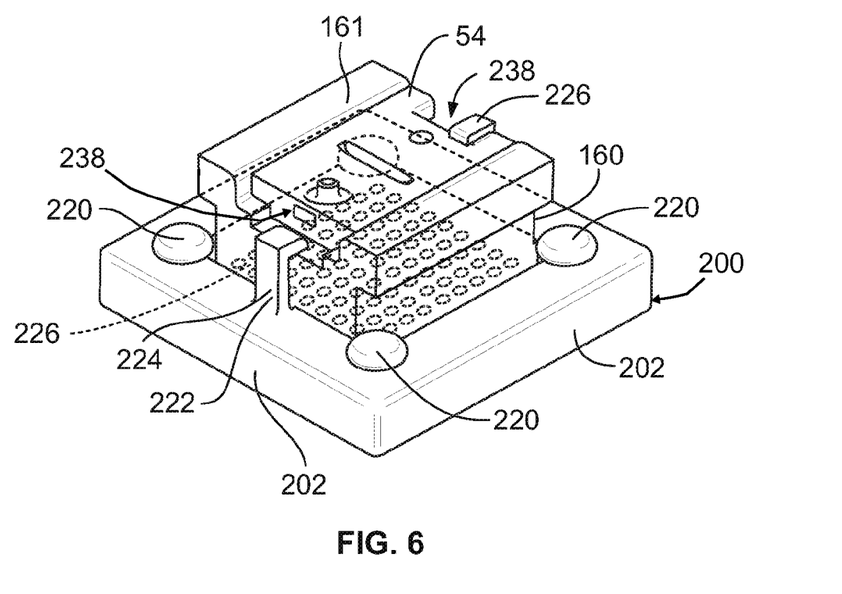
FIG. 6 is a perspective view of the frame shown in FIG. 5 coupled to an electronic module.

FIG. 6 illustrates the frame 200 coupled to the module 54. The module 54 is inserted through the opening 208 in the frame 200. The module 54 is retained in positioned by the frame members 202. The alignment members 220 engage the walls of the recesses 156 of the module 54 so that the electrical connector 66 of the module 54 is aligned with the electrical connector 64 of the circuit board 52. In an alternative embodiment, the alignment members 220 include a locking mechanism that engages a corresponding locking mechanism of the module 54 to lock the module 54 within the frame 200.

The arms 224 of each latch 222 extend along a side 160 of the module 54. The arms 224 may be positioned in contact with the sides 160 of the module 54. Optionally, the arms 224 may be spaced apart from the sides 160 of the module 54. The hooks 226 of each latch 222 are positioned flush with the top 161 of the module 54 to retain the module 54 in contact with the circuit board 52. In the illustrated embodiment, the top 161 of the module 54 includes recesses 238. The hooks 226 engage the module within the recesses 238. Optionally, the top 161 of the module 54 may not include the recesses 238 and the hooks 226 directly engage the top 161 of the module. The hooks 226 may provide a force in the direction of the circuit board 52. The force may reinforce the electrical and/or mechanical connection between the electrical connector 64 and the electrical connector 66.

Figure 7:
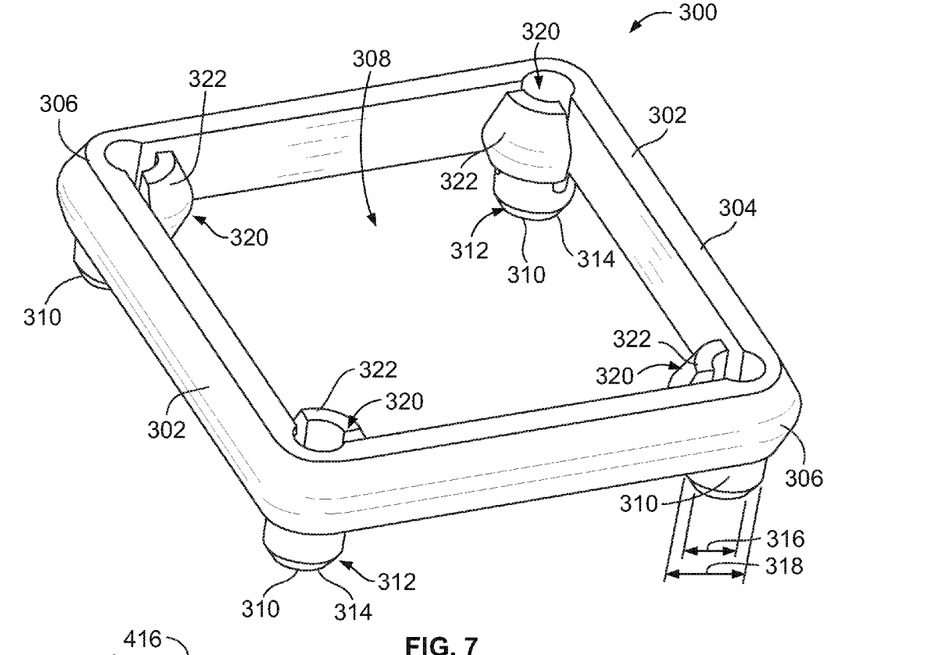
FIG. 7 is a perspective view of an electronic assembly frame formed in accordance with an embodiment.

FIG. 7 illustrates a frame 300 formed in accordance with an embodiment and that may be used with the electronic assembly 50. The frame 300 includes frame members 302. The frame members 302 are coupled to form a base 304 having corners 306 formed at intersections of the frame members 302. The base 304 also includes an opening 308 extending therethrough. The frame 300 is configured to couple to the circuit board 52 so that the base 304 surrounds the electrical connector 64. The opening 308 provides access to the electrical connector 64 when the frame 300 is coupled to the circuit board 52. The module 54 is configured to be received through the opening 308 so that the electrical connector 66 of the module 54 engages the electrical connector 64 of the circuit board 52.

The frame 300 provides a protective cover for the electronic module 54. The frame 300 protects the electronic module 54 and the circuit board 52 from dust and debris. The frame members 302 may extend at least a portion of the height 162 of the module 54 to limit an amount of dust and debris that may come in contact with the module 54. The frame members 302 may also extend an entire height 162 of the module 54.

The frame 300 includes a coupling member 310 extending from each corner 306 of the base 304. The coupling members 310 are configured to be press-fit into the apertures 60 of the circuit board 52. The coupling members 310 include retention features 312 that engage the inner surface 130 of the aperture 60. In the illustrated embodiment, the retention features 310 include tapered ends 314 formed at an end of the coupling member 310. The tapered ends 314 have a first width 316 that is less than the diameter 170 of the aperture 60. The tapered end 314 also has a second width 318 that is greater than the diameter 170 of the aperture 60. The first width 316 enables the coupling member 310 to be inserted into the aperture 60. The second width 318 creates a press-fit between the coupling member 310 and the aperture 60. The retention feature 312 deforms to accommodate press-fit coupling between the coupling members 310 and apertures 60 having varying diameters 170. Alternatively, the aperture 60 may deform to receive the coupling member 310.

An alignment member 320 is positioned at each corner 306 of the base 304. Alternatively, the alignment member 320 may be formed at any intermediate position of the frame members 302 between a pair of corners 306. The alignment member 320 is configured to engage a wall of the recess 156 in the module 54. Optionally, the alignment member 320 may engage any portion of the module 54. The alignment member 320 is configured to align and retain the module 54 on the circuit board 52. The alignment member 320 includes a rounded flange 322. The rounded flange 322 engages the rounded wall of the recess 156 in the module 54. The flange 322 may be flexible so that the flange 322 is moveable with respect to the frame corner 306. The flexibility of the flange 322 enables the frame 300 to receive modules 54 having recesses that may vary in size and/or have variations in design. The flange 322 may exert a force on the module 54 to retain and align the module 54. In alternative embodiments, the alignment member 320 may have any shape that corresponds to a shape of the recess formed on the module 54. Alternatively, the alignment member 320 may be a tab, a notch, a rail, or the like. The alignment member 320 aligns the module 54 with respect to the circuit board 52 so that the electrical connector 66 of the module 54 aligns properly with the electrical connector 64 of the circuit board 52.

Figure 8:
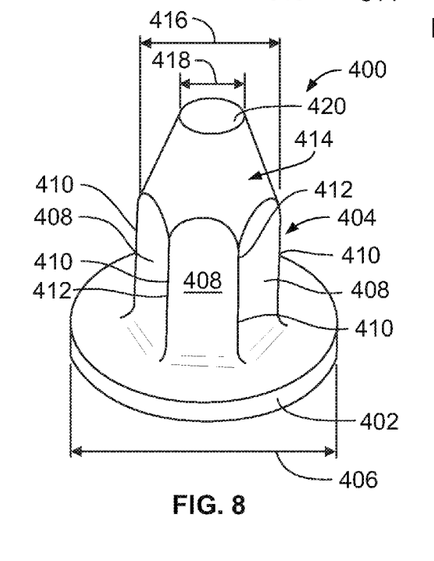
FIG. 8 is a perspective view of a stuffer pin formed in accordance with an embodiment and that may be used with an electronic assembly.

FIG. 8 illustrates a stuffer pin 400 formed in accordance with an embodiment and that may be used with the electronic assembly 50. The stuffer pin 400 is configured to be received within a coupling member, for example, the coupling member 128, shown in FIG. 2. The stuffer pin 400 may be used in place of the coupling plate 144 illustrated in FIG. 2. Alternatively, the electronic assembly 50 that is illustrated in FIG. 2 may utilize both the coupling plate 144 and the stuffer pin 400. Optionally, the stuffer pin 400 may be used with the frame 300 illustrated in FIG. 7. In one embodiment, the coupling members 210 illustrated in FIG. 5 may be adapted to receive the stuffer pin 400.

The stuffer pin 400 includes a base 402 and a pin member 404 extending from the base 402. The base 402 is illustrated as circular, but may have any shape. The base 402 has a width 406 that is greater than the diameter 170 of the aperture 60 formed in the circuit board 52. The base 402 is configured to position flush with the circuit board 52 when the stuffer pin 400 is inserted into a coupling member 128.

The pin member 404 includes a plurality of flat sides 408. The flat sides 408 intersect at corners 410. The corners 410 operate as retention features 412 to retain the stuffer pin 400 within the coupling member 128. The retention features 412 deform to engage the inner surface 173 of the opening 172 formed in the coupling member 128. Optionally, the opening 172 formed in the coupling member 128 may deform to receive the retention features 412. The retention features 412 create an interference fit with the coupling member 128. The stuffer pin 400 is retained with the coupling member 128 through a frictional force generated by the interference fit.

The pin member 404 also includes a tapered end 414. The tapered end 414 has a first width 416 that is greater than the diameter 176 of the opening 172 formed in the coupling member 128. The tapered end 414 has a second width 418 and an end 420 of the pin member 404. The second width 418 is less than the diameter 176 of the opening 172. The second width 418 enables the stuffer pin to be inserted into the coupling member 128. The first width 416 may also operate as a retention feature by deforming to create an interference fit with the coupling member 128. The tapered end 414 and the retention features 412 may be utilized alone or in combination.

Figure 9:
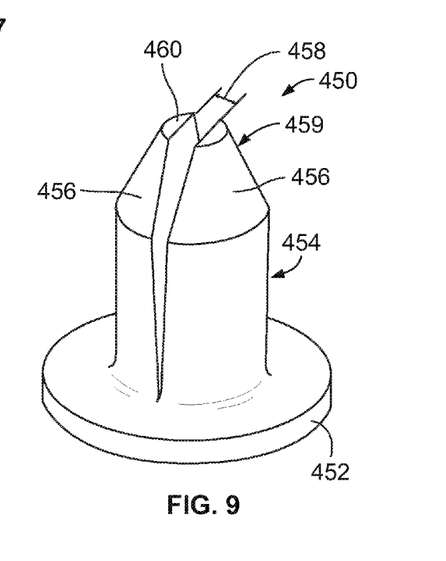
FIG. 9 is a perspective view of a stuffer pin formed in accordance with an embodiment and that may be used with an electronic assembly.

FIG. 9 illustrates a stuffer pin 450 formed in accordance with an embodiment. The stuffer pin 450 includes a base 452 and a pin member 454 extending from the base 452. The pin member 454 includes flexible flanges 456. The illustrated embodiment includes two flexible flanges 456. However, the pin member 454 may include any number of flexible flanges 456. A gap 458 is positioned between, and separates, the flanges 456. The flanges 456 are configured to move toward one another by at least partially closing the gap 458 when force is exerted on the flanges 456. The flanges 456 operate as a retention feature to create an interference fit with the coupling member 128. When inserted into the coupling member 128, the flanges 456 are pushed toward one another to enable the stuffer pin 450 to be received within the coupling member 128. Once inserted into the coupling member 128, the flanges 456 create an interference fit with the coupling member 128 to retain the stuffer pin 450 therein.

The stuffer pin 450 also includes a tapered end 459. The tapered end 459 increases in diameter as the tapered end extends from an end 460 of the stuffer pin 450. The tapered end 459 may also function as a retention feature to retain the stuffer pin 450 within the coupling member 128. The tapered end 459 and the flanges 456 may be utilized alone or in combination.

Figure 10:
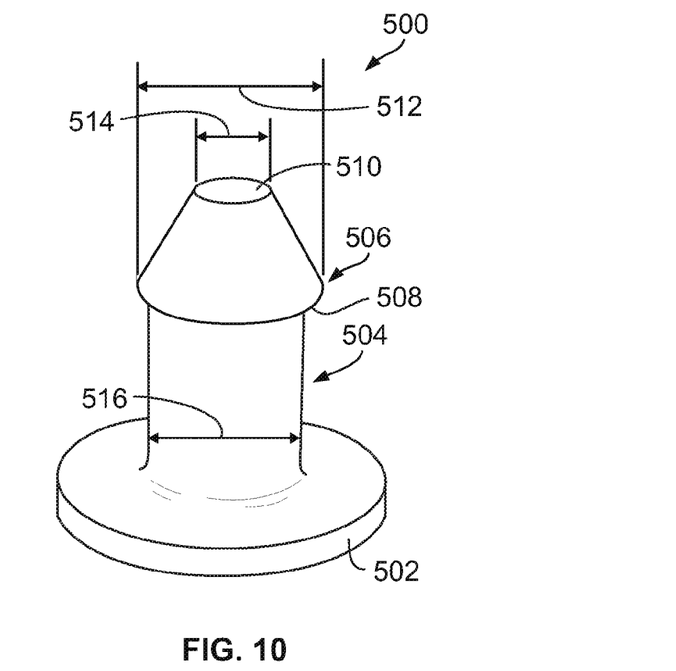
FIG. 10 is a perspective view of a stuffer pin formed in accordance with an embodiment and that may be used with an electronic assembly.

FIG. 10 illustrates a stuffer pin 500 formed in accordance with an embodiment. The stuffer pin 500 includes a base 502 and a pin member 504 extending from the base 502. A retention feature 506 is positioned at an end of the pin member 504 opposite the base 502. The retention feature 506 includes a first end 508 proximate to the pin member 504 and a second end 510 opposite the first end 508. The first end 508 has a first diameter 512 and the second end has a second diameter 514. The first diameter 512 is greater than the second diameter 514. The first diameter 512 is also greater than a diameter 516 of the pin member 504 so that the first end 508 of the retention feature 506 steps out from the pin member 504.

The first diameter 512 is greater than the diameter 176 of the opening 172 in the coupling member 128. The second diameter 514 is less than the diameter 176 of the opening 172. The second diameter 514 enables the stuffer pin 500 to be inserted into the coupling member 128. The first diameter 512 engages the surface 173 of the opening 172 and creates an interference fit between the stuffer pin 500 and the coupling member 128.

Figure 11:
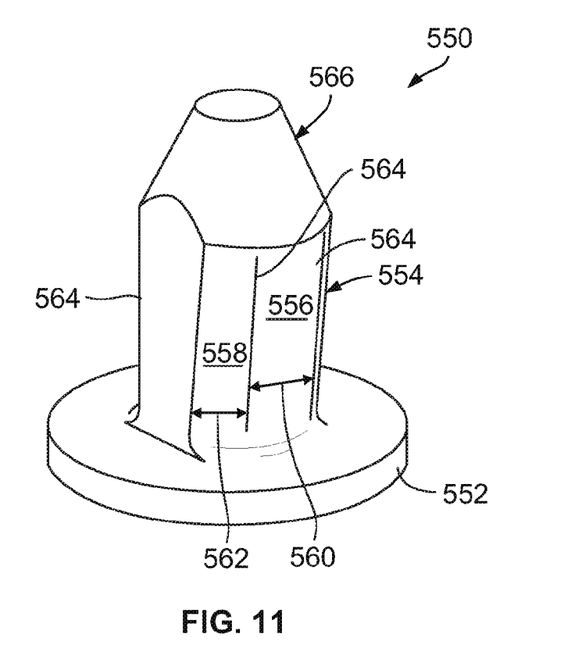
FIG. 11 is a perspective view of a stuffer pin formed in accordance with an embodiment and that may be used with an electronic assembly.

FIG. 11 illustrates a stuffer pin 550 formed in accordance with an embodiment. The stuffer pin 550 includes a base 552 and a pin member 554 extending from the base 552. The pin member 554 includes first sides 556 and second sides 558. The first sides 556 have a length 560 that is greater than a length 562 of the second sides 558. Each first side 556 is positioned between adjacent second sides 558. The first side 556 and the second sides 558 intersect at corners 564. The corners 564 function as retention features that create an interference fit with the coupling members 128. The stuffer pin 550 also includes a tapered end 566 that may also function as a retention feature.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. An alignment frame comprising:
a plurality of frame members coupled together to form a base, the base configured to surround an electronic module to provide a protective cover for the electronic module, the base including corners formed at intersections of the frame members;
an alignment member positioned on at least one corner of the base, the alignment member configured to align the electronic module with respect to an electrical connector on a circuit board; and
a coupling member extending from at least one corner of the base, the coupling member configured to be through-hole mounted to an aperture in the circuit board, the coupling member including a retention feature configured to create a press-fit with an inner surface of the aperture.

2. The alignment frame of claim 1, wherein the coupling member has a cross-sectional width at the retention feature that is greater than a diameter of the aperture, the retention feature accommodating a press-fit with apertures having different diameters.

3. The alignment frame of claim 1, further comprising a latch extending from at least one of the frame members, the latch configured to engage the electronic module to retain the electronic module on the circuit board.

4. The alignment frame of claim 1, wherein at least one frame member has a height that corresponds to at least a portion of a height of the electronic module.

5. The alignment frame of claim 1, wherein at least one frame member has a height that corresponds to at least a height of the electronic module.

6. The alignment frame of claim 1, wherein the alignment member is a flexible flange that engages a recess formed in the electronic module.

7. The alignment frame of claim 1, further comprising a stuffer pin configured to be received within the coupling member, the stuffer pin securing the alignment frame to the circuit board.

8. The alignment frame of claim 1, wherein the coupling member has multiple flat sides, the retention feature formed at a corner formed by a pair of the flat sides.

9. The alignment frame of claim 1, wherein the coupling member has varying diameters along a length of the coupling member, the retention feature formed at the greatest diameter of the coupling member.

10. The alignment frame of claim 1, wherein the retention feature includes a rib positioned along an outer surface of the coupling member.

11. An electronic assembly comprising:
a circuit board having an electrical connector positioned thereon, the circuit board having an aperture extending therethrough;
an electronic module electrically coupled to the electrical connector; and
an alignment frame aligning the electronic module with respect to the electrical connector, the alignment frame comprising:

a plurality of frame members coupled together to form a base, the base surrounding the electronic module to provide a protective cover around the electronic module, the base including corners formed at intersections of the frame members, an alignment member positioned on at least one corner of the base, the alignment member aligning the electronic module with respect to the electrical connector, and a coupling member extending from at least one corner of the base, the coupling member through-hole mounted to the aperture in the circuit board, the coupling member including a retention feature that creates a press-fit with an inner surface of the aperture.

12. The electronic assembly of claim 11, wherein the coupling member has a cross-sectional width at the retention feature that is greater than a diameter of the aperture, the retention feature accommodating a press-fit with apertures having different diameters.

13. The electronic assembly of claim 11 further comprising a latch extending from at least one of the frame members, the latch engaging the electronic module to retain the electronic module on the circuit board.

14. The electronic assembly of claim 11, wherein at least one frame member has a height that corresponds to at least a portion of a height of the electronic module.

15. The electronic assembly of claim 11, wherein at least one frame member has a height that corresponds to at least a height of the electronic module.

16. The electronic assembly of claim 11, wherein the alignment member is a flexible flange that engages a recess formed in the electronic module.

17. The electronic assembly of claim 11 further comprising a stuffer pin received within the coupling member, the stuffer pin securing the alignment frame to the circuit board.

18. The electronic assembly of claim 11, wherein the coupling member has multiple flat sides, the retention feature formed at a corner formed by a pair of the flat sides.

19. The electronic assembly of claim 11, wherein the coupling member has varying diameters along a length of the coupling member, the retention feature formed at the greatest diameter of the coupling member.

20. The electronic assembly of claim 11, wherein the retention feature includes a rib positioned along an outer surface of the coupling member.

* * * * *